(12) United States Patent
Taya

(10) Patent No.: US 9,736,943 B2
(45) Date of Patent: Aug. 15, 2017

(54) POWER MODULE

(71) Applicant: MITSUBISHI ELECTRIC CORPORATION, Chiyoda-ku (JP)

(72) Inventor: Masaki Taya, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/903,531

(22) PCT Filed: May 19, 2014

(86) PCT No.: PCT/JP2014/002607
§ 371 (c)(1),
(2) Date: Jan. 7, 2016

(87) PCT Pub. No.: WO2015/004832
PCT Pub. Date: Jan. 15, 2015

(65) Prior Publication Data
US 2016/0157351 A1  Jun. 2, 2016

(30) Foreign Application Priority Data
Jul. 11, 2013  (JP) ................................ 2013-145656

(51) Int. Cl.
*H05K 1/18* (2006.01)
*H01L 23/04* (2006.01)
(Continued)

(52) U.S. Cl.
CPC ............ *H05K 1/181* (2013.01); *H01L 23/04* (2013.01); *H01L 25/07* (2013.01); *H01L 25/165* (2013.01);
(Continued)

(58) Field of Classification Search
CPC .................... H05K 5/02; H05K 1/181; H05K 2201/09036; H05K 2201/10166; H01L 25/07; H01L 25/65; H01L 23/04
See application file for complete search history.

(56) References Cited

U.S. PATENT DOCUMENTS 6,522,544 B1 * 2/2003 Kimoto ................. H02M 7/003
257/724
6,661,084 B1 * 12/2003 Peterson ............... H01L 25/105
257/680

(Continued)

FOREIGN PATENT DOCUMENTS

JP  60-111071 U  7/1985
JP  06-021330 A  1/1994
(Continued)

OTHER PUBLICATIONS

International Search Report Issued Jun. 10, 2014, in PCT/JP2014/002607 Filed May 19, 2014.
Office Action issued on Jun. 7, 2016 in Japanese Patent Application No. 2015-526138 (with English language translation).

*Primary Examiner* — Courtney Smith
*Assistant Examiner* — Christopher L Augustin
(74) *Attorney, Agent, or Firm* — Oblon, McClelland, Maier & Neustadt, L.L.P.

(57) ABSTRACT

A power module includes: a plurality of partition wall plates that are provided in a case and form a trench; a plurality of relay terminals whose electric potentials are different, that are formed so that the plurality of partition wall plates are positioned therebetween and that are formed to be opposed with each other; a printed circuit board to which the plurality of relay terminals is connected and which is provided with a slit at a position opposing the trench; and a shielding plate that is placed so that one end portion of the shielding plate is positioned in the trench, and so that an amount by which the other end portion thereof protrudes from the slit is larger (Continued)

than amounts by which the relay terminals protrude from the printed circuit board. The power module ensures insulation inside the power module.

20 Claims, 5 Drawing Sheets

(51) Int. Cl.
    *H01L 25/16*     (2006.01)
    *H01L 25/07*     (2006.01)
    *H05K 5/02*     (2006.01)
    *H01L 25/18*     (2006.01)
    *H01L 23/24*     (2006.01)

(52) U.S. Cl.
    CPC ................ *H05K 5/02* (2013.01); *H01L 23/24* (2013.01); *H01L 25/18* (2013.01); *H01L 2224/45144* (2013.01); *H01L 2224/45147* (2013.01); *H01L 2224/48091* (2013.01); *H01L 2224/48137* (2013.01); *H01L 2924/13055* (2013.01); *H05K 2201/09036* (2013.01); *H05K 2201/10166* (2013.01)

(56) References Cited

U.S. PATENT DOCUMENTS

| | | | | |
|---|---|---|---|---|
| 2003/0072117 A1* | 4/2003 | Maekawa | ............... | H02M 1/08 361/86 |
| 2009/0002974 A1* | 1/2009 | Yahata | .................... | B60L 15/20 361/820 |
| 2014/0014924 A1* | 1/2014 | Oh | .......................... | H01L 51/56 257/40 |
| 2014/0240946 A1* | 8/2014 | Fukumasu | .......... | B60L 11/1816 361/811 |

FOREIGN PATENT DOCUMENTS

| | | | |
|---|---|---|---|
| JP | 11-068035 A | | 3/1999 |
| JP | 2002-076257 A | | 3/2002 |
| JP | 2003-204037 A | | 7/2003 |
| JP | 2004-022705 A | | 1/2004 |
| JP | 2006-158020 A | | 6/2006 |
| JP | 2006158020 A | * | 6/2006 |
| JP | 2008-125240 A | | 5/2008 |
| JP | 2012-138559 A | | 7/2012 |
| JP | 2013-48154 A | | 3/2013 |

* cited by examiner

POWER MODULE

TECHNICAL FIELD

The invention relates to a power module provided with a printed circuit board on which a control circuit or the like is formed, especially to an insulation structure for ensuring insulation inside the power module.

BACKGROUND ART

An IGBT (Insulated Gate Bipolar Transistor) is a power semiconductor element that can perform on-off control of a high voltage or a large current. A package in which the IGBT and a freewheel diode for a load current are combined into a circuit, is called as an IGBT module and is used as an elementary component for configuring an inverter circuit or the like.

A power module in which the IGBT module and a printed circuit board on which control circuits such as a driving circuit for the IGBT and a protective circuit are formed are packaged, is called as an IPM (Intelligent Power Module). Because of improvement in convenience and reliability due to built-in control circuits, the power module is widely used for an inverter device or the like.

In order to configure three-phase inverter circuitry, power modules are generally configured as a package called "6-in-1" in which six IGBTs and six diodes are equipped, or as a package called "7-in-1" in which an IGBT and a diode are further added to configure a braking circuit.

As described above, it is general that a power module is equipped with a plurality of IGBTs. In a case where the power modules are used in an inverter circuit, individual IGBTs have different electric potentials; therefore, a relay terminal connected to an IGBT has an electric potential different from that of a relay terminal connected to another IGBT. This leads to a requirement that insulation between the relay terminals is ensured. As the power modules are further downsized or adapted to a higher voltage, it becomes difficult to ensure creepage distances between the relay terminals or space distances therebetween.

In relation to ensuring insulation performance of power modules, Japan Electrical Manufacture's Association (JEM standards) in Japan, or International Electrotechnical Commission (IEC standards) or the like in foreign countries stipulates a creepage distance and space distance which are to be guidelines necessary for insulation in environments in which to use the modules, an applied voltage, or the like.

In a conventional power module, in order to ensure a space distance and creepage distance between parts implemented on a printed circuit board, a structure is adopted in which the printed circuit board is provided with a slit into which a dielectric shielding plate is inserted (for example, refer to Patent Document 1). In the structure, the creepage distance is ensured by the slit, and the space distance is ensured by the shielding plate, which thereby allows interparts distances to be shorter than a stipulated distance.

PRIOR ART DOCUMENT

Patent Document

Patent Document 1: Japanese Patent Laid-Open Publication No. 2006-158020 (Page 8, FIG. 6)

SUMMARY OF THE INVENTION

Problem to be Solved by the Invention

In a conventional power module, relay terminals thereof and its case are integrated with sealing resin; therefore, in a structure in which a shielding plate is inserted into a slit of a printed circuit board, exposed portions of the relay terminals cannot be completely shielded. Because of this, although insulation distances on the printed circuit board can be ensured, insulation distances between the relay terminals cannot be ensured, thereby not allowing the distances between the relay terminals to be shorter than a stipulated distance. A problem has been that it is difficult to downsize the power module.

The present invention is made to solve the problem described above, and obtain a power module whose main body can be downsized by ensuring insulation distances on a printed circuit board and by ensuring insulation distances between relay terminals inside the power module.

Means for Solving Problem

A power module according to the present invention includes: a plurality of partition wall plates that are provided in a case and form a trench; a plurality of relay terminals whose electric potentials are different, that are formed so that the plurality of partition wall plates are positioned therebetween and that are formed to be opposed with each other; a printed circuit board to which the plurality of relay terminals are connected and which is provided with a slit at a position opposing the trench; and a shielding plate that is placed so that one end portion of the shielding plate is positioned in the trench, and so that an amount by which the other end portion thereof protrudes from the slit is larger than amounts by which the relay terminals protrude from the printed circuit board.

Effect of the Invention

In the present invention, a plurality of partition wall plates and a shielding plate are used to ensure the insulation distances on the printed circuit board and to ensure the insulation distances between the relay terminals, allowing the distances between the relay terminals to be shorter than a stipulated distance to thereby downsize the power module.

MODES FOR CARRYING OUT THE INVENTION

Embodiment 1

Figure 1:
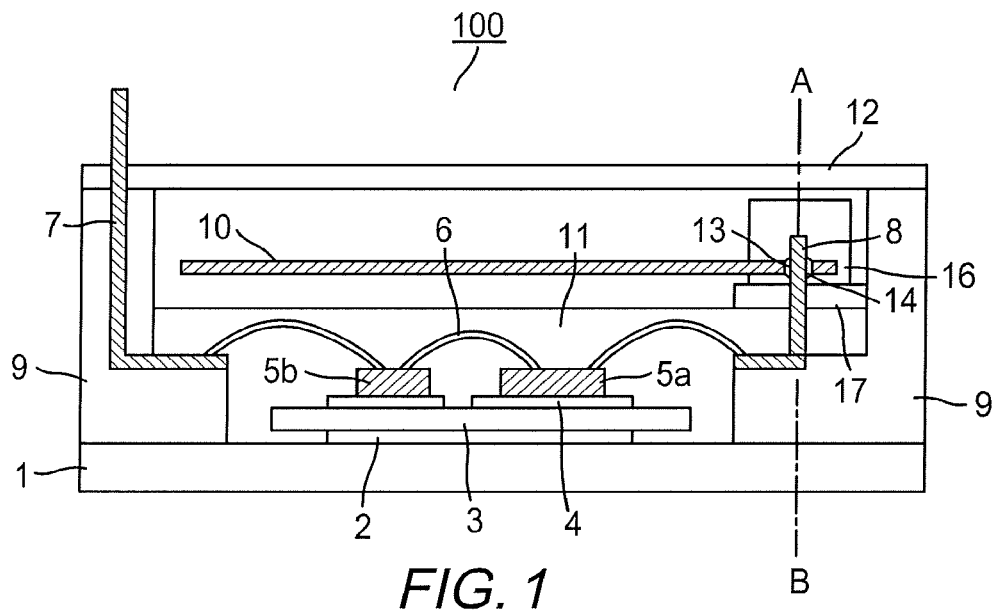
FIG. 1 is a schematic structure cross-sectional view of a power module according to Embodiment 1 of the present invention.
Figure 2:
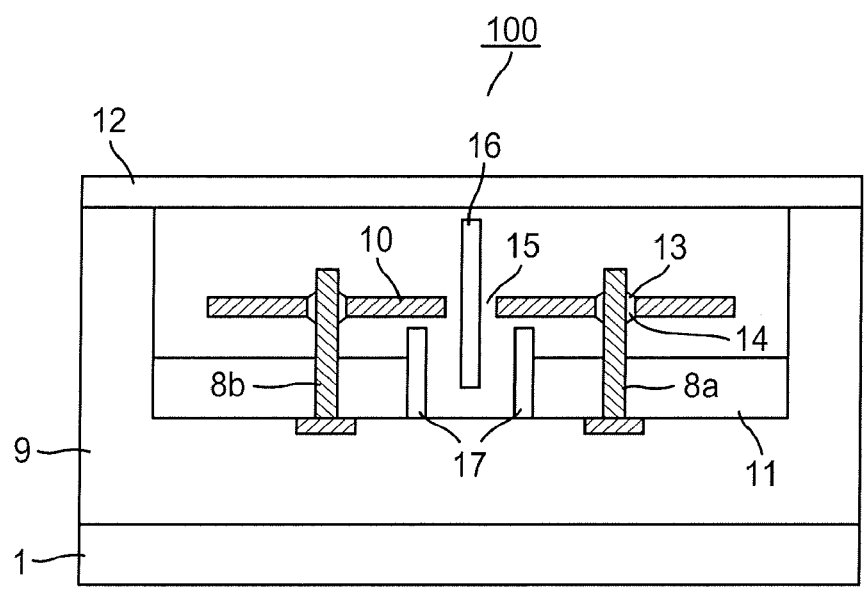
FIG. 2 is a schematic structure cross-sectional view of the power module according to Embodiment 1 of the present invention.

FIG. 1 is a schematic structure cross-sectional view of a power module according to Embodiment 1 of the present invention. FIG. 2 is a schematic structure cross-sectional view of the power module according to Embodiment 1 of the present invention, taken along a dotted line AB in FIG. 1. In FIG. 1, the power module 100 includes a base plate 1, a rear electrode pattern 2, an insulation substrate 3, wiring patterns 4, semiconductors 5 (IGBT 5a, diode 5b), aluminum wires 6, a main terminal 7, a relay terminal 8, a case 9, a printed circuit board 10, sealing resin 11, a lid 12, through-holes 13 formed in the printed circuit board 10, solder 14, a slit 15, a shielding plate 16, and partition wall plates 17 forming a trench.

On the base plate 1, the rear electrode pattern 2 is placed, on which the insulation substrate 3 is placed. On a side of the insulation substrate 3 that is opposite to a face where the rear electrode pattern 2 is formed, the IGBT 5a and the diode 5b being the semiconductors 5 are mounted through the metal wiring patterns 4. In addition, the case 9 is adhered to a circumference portion of the base plate 1.

The semiconductors 5 such as the IGBT 5a and the diode 5b, the wiring patterns 4, the main terminal 7, and the relay terminal 8 are electrically connected therebetween by the aluminum wires 6. The main terminal 7 is a terminal for outputting or inputting a current to or from the exterior of the module. The relay terminal 8 is a terminal to connect the printed circuit board 10 and the IGBT 5a; an IGBT driving circuit on the printed circuit board 10 controls the IGBT 5a through the relay terminal 8. The main terminal 7 and the relay terminal 8 are integrated with the case 9 by insert molding. In addition, although the aluminum wires are used as bonding wires in Embodiment 1, they are not limited to the aluminum wires; materials such as copper wires having a low resistance value may be used. Use of material having a low resistance value such as copper wire allows large currents to be applied. In a case where gold wires are used, similar effects can be obtained. In addition, the printed circuit board 10 may be configured so as to function other than driving the IGBT 5a.

The case 9 is formed of insulating material. The interior of the case 9 is filled with insulating resin such as silicone gel or epoxy resin to seal up to the tops of the aluminum wires 6. At this moment, a portion of the relay terminal 8 connecting to the printed circuit board 10 is not covered with the sealing resin 11, but is exposed for soldering the relay terminal 8 to the printed circuit board 10. A through-hole 13 is provided at a portion on the printed circuit board 10 where the relay terminal 8 is connected. The relay terminal 8 inserted in the through-hole 13 is connected to the printed circuit board 10, using the solder 14. The printed circuit board 10 is provided with the slit 15. Although not shown in the figures, the power module is provided with a plurality of IGBTs 5a, each of which is connected to a different relay terminal 8. Furthermore, although not shown in the figures, one or more relay terminals 8 may be connected to each of the IGBTs 5a.

The slit 15 is provided between the relay terminal 8a and the relay terminal 8b which are connected to different IGBTs 5a and have different electric potentials. As shown in FIG. 2, the partition wall plates 17 to form a trench are integrally formed together with the case 9 between the relay terminal 8a and relay terminal 8b. The top end portion of each partition wall plate 17 is made higher than the height of the sealing resin 11 with which to fill a region circumferentially surrounding the trench. Because of this structure, the trench being the inside of the partition wall plates 17 is not filled with the sealing resin 11.

The partition wall plates 17 are formed below the slit 15 formed in the printed circuit board 10 so that the trench formed with the partition wall plates 17 is positioned under the slit 15. The insulating shielding plate 16 is inserted into both the slit 15 and the trench formed with the partition wall plates 17. Furthermore, the bottom end portion of the shielding plate 16, i.e. an end portion of the shielding plate 16, is placed in the trench formed with the partition wall plates 17. The shielding plate 16 is arranged so that an amount by which the top end portion of the shielding plate 16, that is another end of the shielding plate 16, protrudes from the slit 15 becomes larger than an amount by which the relay terminal 8a or the relay terminal 8b protrudes from the printed circuit board 10. Furthermore, by making longer the distances between the top end portion of the shielding plate 16 and the top end portions of the relay terminal 8a and relay terminal 8b, the insulation distance between the relay terminals can made longer, thereby improving the insulation performance between the relay terminals. Furthermore, a longer distance between the bottom end portion of the shielding plate 16 and the top end portion of each partition wall plate 17 can cause a longer insulation distance between the relay terminals, improving the insulation performance between the relay terminals. In addition, the bottom end portion of the shielding plate 16 may be placed in a gap in the sealing resin 11 with which to fill a region circumferentially surrounding the trench. Such a placement can also improve the insulation performance between the relay terminals 8.

In a state that the shielding plate 16 is placed in the gap in the sealing resin 11, a distance from the bottom end portion of the shielding plate 16 to the top end portion of the partition wall plate 17 may be made longer. That is, the bottom end portion of the shielding plate 16 may be positioned so as to shield down to a portion lower than the filling height of the sealing resin 11. By adopting this structure, it becomes possible to insulate more effectively. It suffices that the shielding plate 16 is positioned so that the distance (interval) between the relay terminal 8a and relay terminal 8b becomes a stipulated distance satisfying insulation standards specified according to specifications of a module to be used. Furthermore, it suffices that the shielding plate 16 has, in a direction in which to cut out the slit 15, a size (width) by which the insulation distance between the relay terminals can be increased.

The shielding plate 16 is fixed to an inner side face of the case 9 or to the bottom face of the trench formed with the partition wall plates 17. Although fixing methods will not be limited, it suffices that, for example, an adhesive is used or a trench for fixation is formed in a wall face of the case 9 or the bottom face thereof for inserting the shielding plate. In addition, the shielding plate 16 may be fixed to the printed circuit board 10.

In the power module configured as described above, each of the space distance between the relay terminal 8a and relay terminal 8b and the creepage distance therebetween corresponds to a path detouring the shielding plate 16, thereby causing both the space distance and the creepage distance to be extended and making it possible to reduce the distance between the relay terminals shorter than the stipulated distance. This enables the power module to be downsized.

Furthermore, this makes it possible that after the relay terminals 8a and 8b are joined by soldering to the printed circuit board 10, the shielding plate 16 is placed. In a case where the shielding plate 16 is placed before a solder joint step, a short distance between the relay terminal 8a and relay terminal 8b causes interference between a jig for the soldering and the shielding plate 16, lowering soldering productivity. However, by adopting the structure of Embodiment 1, the distance between the relay terminals 8 can be shortened without lowering the soldering productivity.

Explanation has been made about a case of two relay terminals 8 having different electric potentials; however, in a case where a plurality of semiconductors 5 is provided and two or more relay terminals 8 having different electric potentials are provided, a similar effect can be obtained by adopting a similar configuration.

In addition, although each of the slit 15 and the shielding plate 16 has been provided at a single position between the relay terminals 8 having different electric potentials, they may be provided at a plurality of positions therebetween. By providing the shielding plate 16 at the plurality of positions, the insulation between the relay terminals 8 can be more effectively performed.

Moreover, although the joining between the printed circuit board 10 and relay terminal 8 has been performed by soldering, a general method for joining, the joining method is not limited to the soldering. Connectors or press-fit terminals may be used for the joining. The connector joining or the press-fit joining can simplify the joining step.

Embodiment 2

The structure in Embodiment 2 differs in that the lid 12 and the shielding plate 16 having been formed as separated parts in Embodiment 1 are integrated using insulating material. Because the lid 12 and the shielding plate 160 are integrally formed, combining the lid 12 can be performed simultaneously with placing the shielding plate 160. This can reduce the number of parts forming the power module 200, thereby reducing the number of assembly steps.

Figure 3:
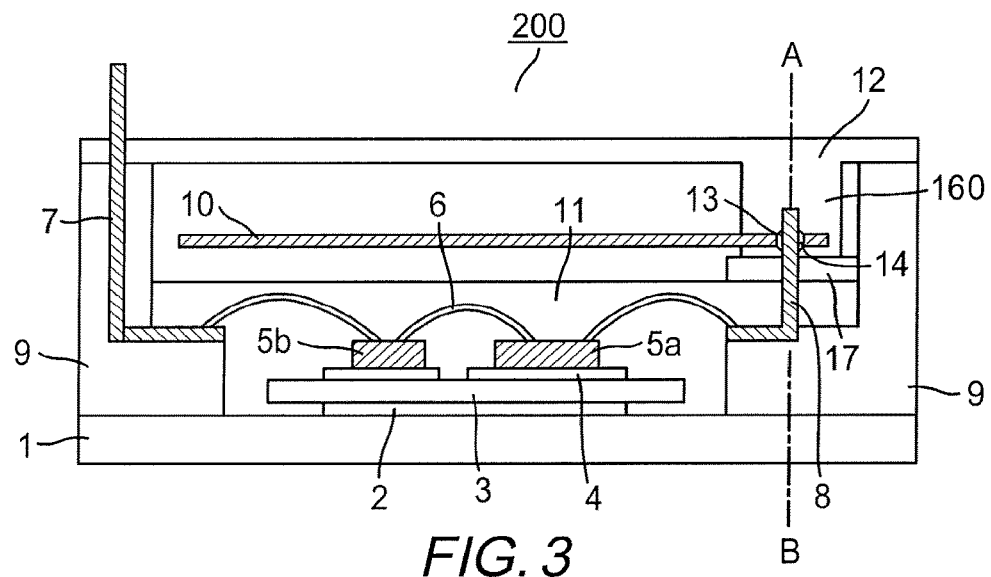
FIG. 3 is a schematic structure cross-sectional view of a power module according to Embodiment 2 of the present invention.
Figure 4:
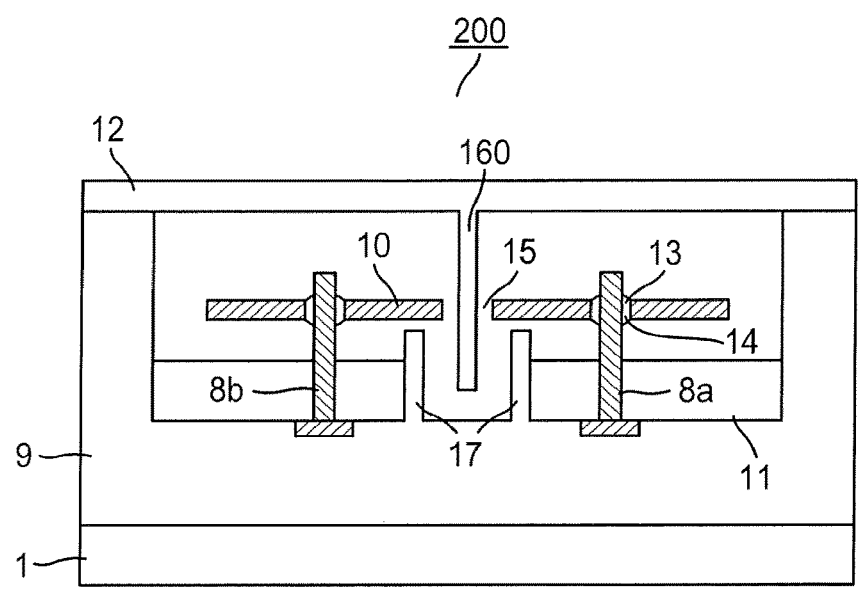
FIG. 4 is a schematic structure cross-sectional view of the power module according to Embodiment 2 of the present invention.

FIG. 3 is a schematic structure cross-sectional view of a power module according to Embodiment 2 of the present invention. FIG. 4 is a schematic structure cross-sectional view of the power module according to Embodiment 2 of the present invention, taken along a dotted line AB in FIG. 3. In FIG. 3, the power module 200 includes a base plate 1, a rear electrode pattern 2, an insulation substrate 3, wiring patterns 4, semiconductors 5 (IGBT 5a, diode 5b), aluminum wires 6, a main terminal 7, a relay terminal 8, a case 9, a printed circuit board 10, sealing resin 11, a lid 12, through-holes 13 formed in the printed circuit board 10, solder 14, a slit 15, a shielding plate 160 that is integrally formed with the lid 12 using insulating material, and partition wall plates 17 forming a trench.

The lid 12 is integrally provided with the shielding plate 160 at a position corresponding to that of the slit 15 formed in the printed circuit board 10. Because of this, it is not necessary to separately prepare a means for fixing the shielding plate 160. Furthermore, by the integrated structure, an insulation distance between portions of relay terminals 8 protruding from the printed circuit board 10 can be effectively extended.

In the power module configured as described above, each of the space distance between the relay terminal 8a and the relay terminal 8b and the creepage distance therebetween corresponds to a path detouring the shielding plate 160, thereby causing both the space distance and the creepage distance to be extended and making it possible to reduce the distance between the relay terminals shorter than the stipulated distance. By adopting the structure, each of the space distance and the creepage distance can be extended more effectively, which makes it possible to downsize the power module.

Furthermore, by integrally forming the lid 12 with the shielding plate 160, the number of parts can be reduced, thereby reducing the number of assembly steps.

Embodiment 3

The structure in Embodiment 3 differs in that the top end portions of the partition wall plates 17 forming the trench in the case 9 used in Embodiment 1 are in contact with the rear face of the printed circuit board 10. Because the top end portions of the partition wall plates 170 are in contact with the rear face of the printed circuit board 10, solder balls can be prevented from intruding into the rear face side of the printed circuit board 10 and from causing a short-circuit failure.

Figure 5:
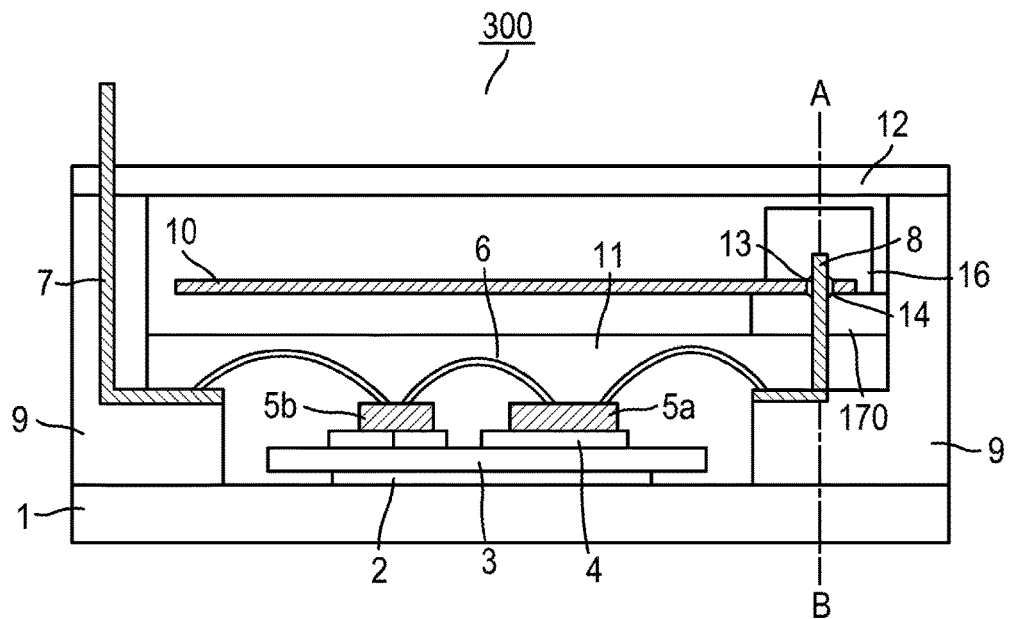
FIG. 5 is a schematic structure cross-sectional view of a power module according to Embodiment 3 of the present invention.
Figure 6:
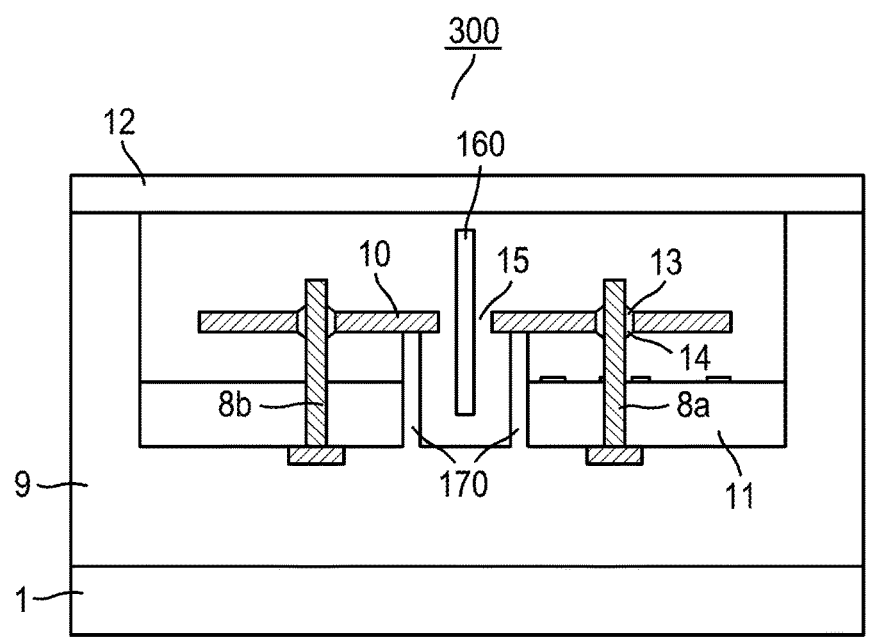
FIG. 6 is a schematic structure cross-sectional view of the power module according to Embodiment 3 of the present invention.

FIG. 5 is a schematic structure cross-sectional view of a power module according to Embodiment 3 of the present invention. FIG. 6 is a schematic structure cross-sectional view of the power module according to Embodiment 3 of the present invention, taken along a dotted line AB in FIG. 5. In FIG. 5, the power module 300 includes a base plate 1, rear electrode patterns 2, an insulation substrate 3, wiring patterns 4, semiconductors 5 (IGBT 5a, diode 5b), aluminum wires 6, a main terminal 7, a relay terminal 8, a case 9, a printed circuit board 10, sealing resin 11, a lid 12, through-holes 13 formed in the printed circuit board 10, solder 14, a slit 15, a shielding plate 16, and partition wall plates 170 forming a trench and being in contact with the printed circuit board 10.

When a relay terminal 8a or a relay terminal 8b is soldered to the printed circuit board 10, excess of the solder 14 may sometimes produce a solder ball. When the solder ball is produced, there exists a possibility that the solder ball passes the slit 15 to intrude into the rear face of the printed circuit board 10 and touch conductive parts on the rear face of the printed circuit board 10, causing a short-circuit failure.

However, the structure of Embodiment 3 makes the solder ball stay in a trench formed with the partition wall plates 170, thereby preventing the solder ball from intruding into the rear face side of the printed circuit board 10 and from causing a short-circuit failure.

In the power module configured as described above, each of the space distance between the relay terminal 8a and relay terminal 8b and the creepage distance therebetween corresponds to a path detouring the shielding plate 16, thereby causing both the space distance and the creepage distance to be extended and making it possible to reduce the distance between the relay terminals shorter than the stipulated distance.

Furthermore, the structure of Embodiment 3 makes the solder ball stay in a trench formed with the partition wall plates 170, thereby preventing the solder ball from intruding into the rear face side of the printed circuit board 10 and from causing a short-circuit failure.

Moreover, by covering with insulating resin portions of the top end portions of the partition wall plates 170 with which the rear face of the printed circuit board 10 is in contact, insulation performance between the relay terminals 8 under the rear face of the printed circuit board 10 can be improved.

Moreover, it is possible that the power module has a combination structure of Embodiment 2 and Embodiment 3 in a range allowed in manufacturing processes. By adopting the structure, either of the space distance and the creepage distance can be extended more effectively, thereby downsizing the power module.

Embodiment 4

The structure in Embodiment 4 differs in that the printed circuit board 10 used in Embodiment 1 is provided with an external terminal 18 through which an electric signal is exchanged with the IGBT driving circuit formed on the printed circuit board 10. By providing the external terminal 18, the operation state of the IGBT 5a or the like which is connected through the relay terminal 8 and placed in the power module 400 can be controlled or monitored from the outside of the power module 400.

Figure 7:
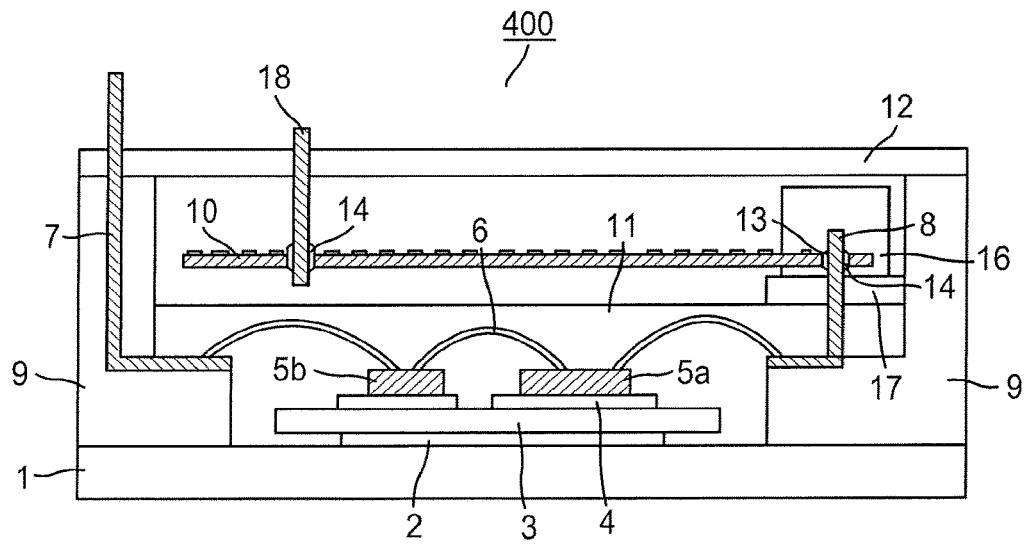
FIG. 7 is a schematic structure cross-sectional view of a power module according to Embodiment 4 of the present invention.

FIG. 7 is a schematic structure cross-sectional view of a power module according to Embodiment 4 of the present invention. In FIG. 7, the power module 400 includes a base plate 1, rear electrode patterns 2, an insulation substrate 3, wiring patterns 4, semiconductors 5 (IGBT 5a, diode 5b), aluminum wires 6, a main terminal 7, a relay terminal 8, a case 9, a printed circuit board 10, sealing resin 11, a lid 12, through-holes 13 formed in the printed circuit board 10, solder 14, a slit 15, a shielding plate 16, partition wall plates 17 forming a trench, and an external terminal 18.

The semiconductors 5 placed in the power module 400 sometimes change their operation states over time depending on a use condition (temperature in usage environment) of the power module 400. When continuing operation of the semiconductors 5 under a same operational condition without addressing a change in the use condition, the semiconductors 5 could malfunction, resulting in that the power module 400 does not operate desirably.

However, adoption of the structure in Embodiment 4 allows observing, using the electric signal from the external terminal 18, changes in operation states of the semiconductors 5 due to changes in the operation state of the power module 400; the observation further allows, for example, deterioration diagnosis of the semiconductors 5 or reset of the operation condition thereof. This enables the semiconductors 5 to be prevented from malfunctioning and continue operating at a suitable operation condition.

In the power module configured as described above, each of the space distance between the relay terminal 8a and relay terminal 8b and the creepage distance therebetween corresponds to a path detouring the shielding plate 16, thereby causing both the space distance and the creepage distance to be extended and making it possible to reduce the distance between the relay terminals shorter than the stipulated distance.

Furthermore, the adoption of the structure in Embodiment 4 allows monitoring and diagnosing operation states of the semiconductors 5 in the power module 400 through the external terminal 18, thereby extending the life span of the power module.

Embodiment 5

The structure in Embodiment 5 differs in that the sealing resin 11 is also injected into the trench which has been used in Embodiment 1 and formed with the partition wall plates 17. The bottom end of the shielding plate 16 is positioned lower than the filling height of the sealing resin 11. By injecting the sealing resin 11 also into the trench, the insulation distance between the relay terminals 8 can be made further longer, thereby improving the insulation performance between the relay terminals.

Figure 8:
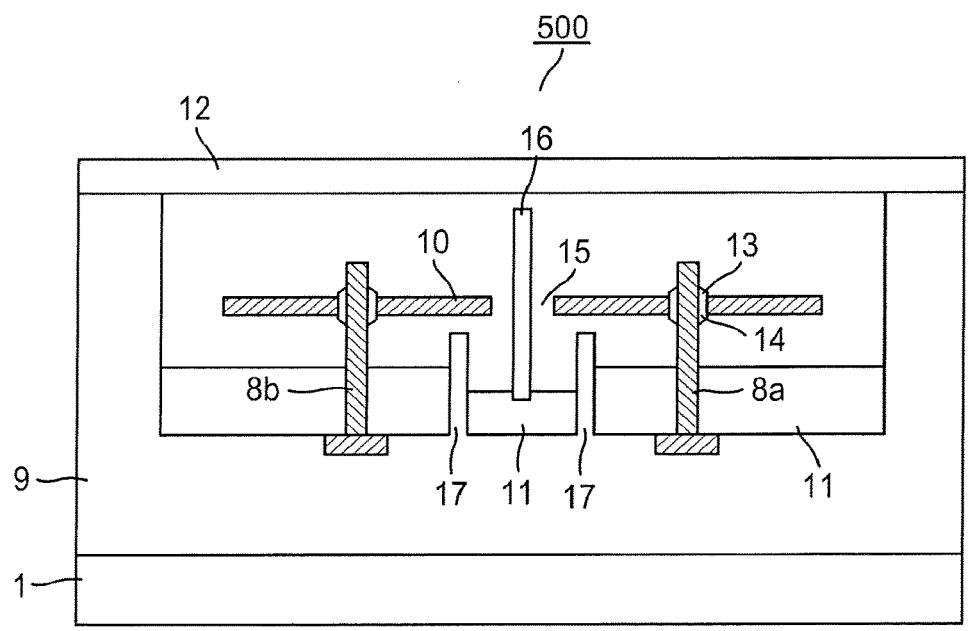
FIG. 8 is a schematic structure cross-sectional view of a power module according to Embodiment 5 of the present invention.

FIG. 8 is a schematic structure cross-sectional view of a power module according to Embodiment 5 of the present invention. In FIG. 8, the power module 500 includes a base plate 1, relay terminals 8, a case 9, a printed circuit board 10, sealing resin 11, a lid 12, through-holes 13 formed in the printed circuit board 10, solder 14, a slit 15, a shielding plate 16, and partition wall plates 17 forming a trench. A cross-sectional structure along another direction is the same as that shown in FIG. 1.

The power module 500 of Embodiment 5 can be manufactured as follows. The sealing resin 11 is injected into the case 9 and into the trench formed with the partition wall plates 17. Next, the printed circuit board 10 is connected to the relay terminals 8 by, for example, soldering. Next, the shielding plate 16 is inserted into the slit 15 and into the trench formed with the partition wall plates 17. At this time point, the sealing resin 11 has not hardened and has fluidity; therefore, the bottom end of the shielding plate 16 can be placed so as to be buried in the sealing resin 11 filled in the trench. After that, the sealing resin 11 is cured to harden, so that the structure of the power module in Embodiment 5 can be manufactured.

Furthermore, by the following procedure, the power module 500 according to Embodiment 5 can also be manufactured. The printed circuit board 10 is connected to the relay terminals 8 by, for example, soldering. Next, the sealing resin 11 is injected into the case 9 and into the trench formed with the partition wall plates 17. If at this time point, an opening for injecting the sealing resin 11 has been formed in the printed circuit board 10 or an opening for injecting the sealing resin 11 between the printed circuit board 10 and the case 9 has been formed, it is possible to improve injectability of the sealing resin 11. When injecting the sealing resin 11 into the trench formed with the partition wall plates 17, the slit 15 formed in the printed circuit board 10 may be similarly utilized. Next, the shielding plate 16 is inserted into the slit 15 formed in the printed circuit board 10 and into the trench formed with the partition wall plates 17, and then the sealing resin 11 is cured to harden.

Moreover, by the following procedure, the power module 500 according to Embodiment 5 can also be manufactured. After connecting the printed circuit board 10 to the relay terminals 8 by soldering or the like, the shielding plate 16 is inserted into the slit 15 and the trench formed with the partition wall plates 17. After that, the sealing resin 11 is injected into the case 9 and into the trench formed with the partition wall plates 17, and then the sealing resin 11 is cured to harden. If at this time point, an opening for injecting the sealing resin 11 has been formed in the printed circuit board 10 or an opening for injecting the sealing resin 11 between the printed circuit board 10 and the case 9 has been formed, it is possible to improve a performance about injecting the sealing resin 11.

If a height of the sealing resin 11 injected to fill the trench formed with the partition wall plates 17 is set to be higher than the bottom end of the shielding plate 16, it is not necessarily required that the height is as high as a filling height of the sealing resin 11 injected into the case 9. By placing the bottom end of the shielding plate 16 at a lower position as shown in FIG. 8, the filling height of the sealing resin 11 injected in the trench formed with the partition wall plates 17 can be made lower than the filling height of the sealing resin 11 injected in the case 9, thereby minimizing the usage amount of the sealing resin 11.

Figure 9:
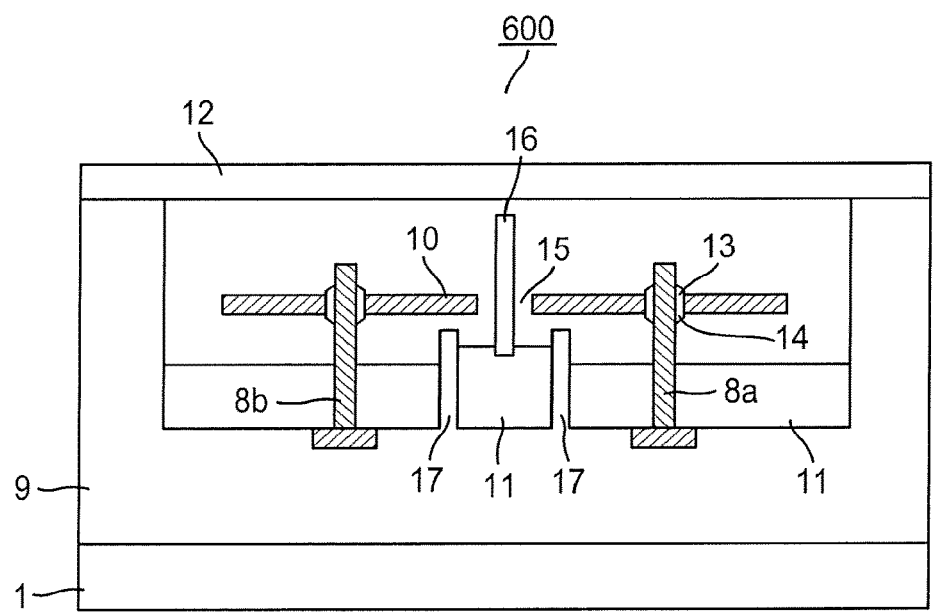
FIG. 9 is a schematic structure cross-sectional view of another power module according to Embodiment 5 of the present invention.

FIG. 9 is a schematic structure cross-sectional view of another power module according to Embodiment 5 of the present invention. In FIG. 9, the power module 600 includes a base plate 1, relay terminals 8, a case 9, a printed circuit board 10, sealing resin 11, a lid 12, through-holes 13 formed in the printed circuit board 10, solder 14, a slit 15, a shielding plate 16, and partition wall plates 17 forming a trench. A cross-sectional structure along another direction is the same as that shown in FIG. 1.

By making the filling height of the sealing resin 11 injected in the trench formed with the partition wall plates 17 higher than the filling height of the sealing resin 11 injected in the case 9 as shown in FIG. 9, the bottom end of the shielding plate 16 can be placed at a higher position, thereby minimizing the usage amount of material for manufacturing the shielding plate 16.

It is allowed that material of the sealing resin 11 injected into the trench formed with the partition wall plates 17 is not the same as that of the sealing resin 11 injected into the case 9, as long as the material is insulating. Because in the trench formed with the partition wall plates 17, there are no wiring portions such as the aluminum wires 6 nor the semiconductors 5, a material may be used which is inferior in the heat resistance or the environmental durability.

In Embodiment 5, the partition wall plates 17 forming the trench are provided; however, for example, in a case where there is no limitation about the size of the power module, the shielding plate 16 may be placed in the sealing resin 11 without providing the trench. This can simplify manufacturing steps while keeping long the insulation distance between the relay terminals 8.

In the power module configured as described above, each of the space distance between the relay terminal 8a and relay terminal 8b and the creepage distance therebetween corresponds to a path detouring the shielding plate 16, causing both the space distance and the creepage distance to be extended and making it possible to reduce the distance between the relay terminals shorter than the stipulated distance.

Furthermore, because the sealing resin 11 is injected into the trench formed with the partition wall plates 17 and the injected sealing resin 11 has a filling height so as to be in contact with the shielding plate 16, each of the space distance between the relay terminal 8a and relay terminal 8b and the creepage distance therebetween corresponds to a path detouring the shielding plate 16, causing both the space distance and the creepage distance to be extended and making it possible to reduce the distance between the relay terminals shorter than the stipulated distance.

Furthermore, a material of the sealing resin 11 injected in the trench formed with the partition wall plates 17 may differ from a material of the sealing resin 11 injected in the case 9. This makes it possible to select material according to how and where to use.

NUMERAL EXPLANATION 1 base plate
2 rear metal pattern
3 insulation substrate
4 wiring pattern
5 semiconductor
5a IGBT
5b diode
6 aluminum wire
7 main terminal
8, 8a, 8b relay terminal
9 case
10 printed circuit board
11 sealing resin
12 lid
13 through-hole
14 solder
15 slit
16, 160 shielding plate
17, 170 partition wall plate
18 external terminal
100, 200, 300, 400, 500, 600 power module

The invention claimed is:

1. A power module comprising:
a plurality of partition wall plates that are provided in a case and form a trench;
a plurality of relay terminals whose electric potentials are different, that are formed so that the plurality of partition wall plates are positioned therebetween and that are formed to be opposed with each other;
a printed circuit board to which the plurality of relay terminals are connected and which includes a slit at a position opposing the trench; and
a shielding plate that is placed so that one end portion of the shielding plate is positioned in the trench, and so that an amount by which the other end portion thereof protrudes from the slit is larger than amounts by which the relay terminals protrude from the printed circuit board.

2. The power module according to claim 1, wherein the one end portion of the shielding plate is placed in a gap in sealing resin filling a region circumferentially surrounding the trench in the case.

3. The power module according to claim 2, wherein the trench is further filled with the sealing resin, and the one end portion of the shielding plate is in contact with the sealing resin filling the trench.

4. The power module according to claim 3, wherein the resin filling the region circumferentially surrounding the trench is different in material from the resin filling the trench.

5. The power module according to claim 1, wherein the shielding plate is formed integrally with a lid of the case.

6. The power module according to claim 1, wherein a top end portion of each of the partition wall plates is in contact with the printed circuit board.

7. The power module according to claim 1, wherein the printed circuit board includes an external terminal connecting outside the case.

8. The power module according to claim 2, wherein the shielding plate is formed integrally with a lid of the case.

9. The power module according to claim 2, wherein a top end portion of each of the partition wall plates is in contact with the printed circuit board.

10. The power module according to claim 2, wherein the printed circuit board includes an external terminal connecting outside the case.

11. The power module according to claim 5, wherein a top end portion of each of the partition wall plates is in contact with the printed circuit board.

12. The power module according to claim 5, wherein the printed circuit board includes an external terminal connecting outside the case.

13. The power module according to claim 6, wherein the printed circuit board includes an external terminal connecting outside the case.

14. The power module according to claim 3, wherein the shielding plate is formed integrally with a lid of the case.

15. The power module according to claim 3, wherein a top end portion of each of the partition wall plates is in contact with the printed circuit board.

16. The power module according to claim 3, wherein the printed circuit board includes an external terminal connecting outside the case.

17. The power module according to claim 8, wherein a top end portion of each of the partition wall plates is in contact with the printed circuit board.

18. The power module according to claim 8, wherein the printed circuit board includes an external terminal connecting outside the case.

19. The power module according to claim 9, wherein the printed circuit board includes an external terminal connecting outside the case.

20. The power module according to claim 11, wherein the printed circuit board includes an external terminal connecting outside the case.

* * * * *